United States Patent [19]

McClaskey

[11] 3,932,821

[45] Jan. 13, 1976

[54] OUT OF LOCK DETECTOR FOR PHASE LOCK LOOP SYNTHESIZER

[75] Inventor: Boyd M. McClaskey, Flourtown, Pa.

[73] Assignee: Narco Scientific Industries, Inc., Fort Washington, Pa.

[22] Filed: Nov. 8, 1974

[21] Appl. No.: 522,053

[52] U.S. Cl. .................................. 331/25; 331/74
[51] Int. Cl.² ........................................ H03B 3/04
[58] Field of Search ........... 331/1 R, 17, 18, 25, 74, 331/75; 325/417, 419, 439

[56] References Cited
UNITED STATES PATENTS

| | | | |
|---|---|---|---|
| 3,354,403 | 11/1967 | Thomas | 331/18 |
| 3,611,175 | 10/1971 | Boelke | 331/17 X |

*Primary Examiner*—Siegfried H. Grimm
*Attorney, Agent, or Firm*—Paul & Paul

[57] ABSTRACT

In a radio synthesizer adapted for use in an aircraft transceiver, an out of lock detector which enables or inhibits output from the synthesizer depending upon whether the synthesizer phase lock loop is in or out of lock. Under normal in lock operating conditions the oscillator output is coupled to the input of an output amplifier. When the loop is out of lock, pulse signals are generated at the loop phase detector and peak integrated to produce a signal which inhibits transmission of the oscillator output to the output amplifier, so that no output is produced while the synthesizer searches for a selected frequency.

9 Claims, 2 Drawing Figures

3,932,821

OUT OF LOCK DETECTOR FOR PHASE LOCK LOOP SYNTHESIZER

BACKGROUND OF THE INVENTION

1. Field of the Invention

This invention lies in the field of radio synthesizers and, more particularly, detectors for determining when a phase lock loop synthesizer is out of lock.

2. Description of the Prior Art

The circuit of this invention finds particular use in connection with a phase lock loop synthesizer utilized within an aircraft radio transceiver. The assignee of this invention has recently designed an avionics transceiver to meet the 720 channel selectivity requirement, which transceiver utilizes a synthesizer module employing the latest digital techniques to assure accurate lock-on. While lock-on is quickly and efficiently achieved with this apparatus, there is a period of search following each selection of a new frequency, during which search period the oscillator is being tuned to the newly selected frequency. During this search period when the loop is out of lock, the oscillator output does not correspond to any desired channel frequency, and it is during this period that the detector of this invention inhibits transmission from the oscillator through to either the receiver or transmitter portion of the apparatus, so that extraneous communication is avoided. As soon as the loop is in lock, assuring that the oscillator has been tuned to precisely the desired frequency corresponding to a selected channel, the output circuit is enabled so that the transceiver function proceeds.

SUMMARY OF THE INVENTION

It is an object of this invention to provide efficient means for inhibiting synthesizer output in an aircraft radio transceiver when the synthesizer output is not locked at the selected frequency.

It is another object of this invention to provide an out of lock detector for a phase lock loop synthesizer, such out of lock detector providing for rapid inhibiting action when the synthesizer is out of lock.

It is another object of this invention to provide, for use with a phase lock loop synthesizer system, means for inhibiting transmission of the output of such system when the loop is not phase/frequency locked, and which inhibiting means interfaces with the synthesizer efficiently and reliably, and requires a minimum of components.

In accordance with the above objectives, there is provided, in a phase lock loop system for generating a pulse signal at a selected frequency, out of lock detector apparatus for generating a signal representative of the in lock/out of lock status of the system loop, a signal output circuit for normally transmitting the output of the synthesizer oscillator, and enabling means for normally enabling said output circuit and for disenabling said output circuit when the system is out of lock. The out of lock circuit produces a DC signal representative of the in lock/out of lock status of the loop, which signal responds quickly to a loop change from in lock to out of lock, and relatively slowly to a change from out of lock to in lock.

DESCRIPTION OF THE PREFERRED EMBODIMENT

Figure 1:
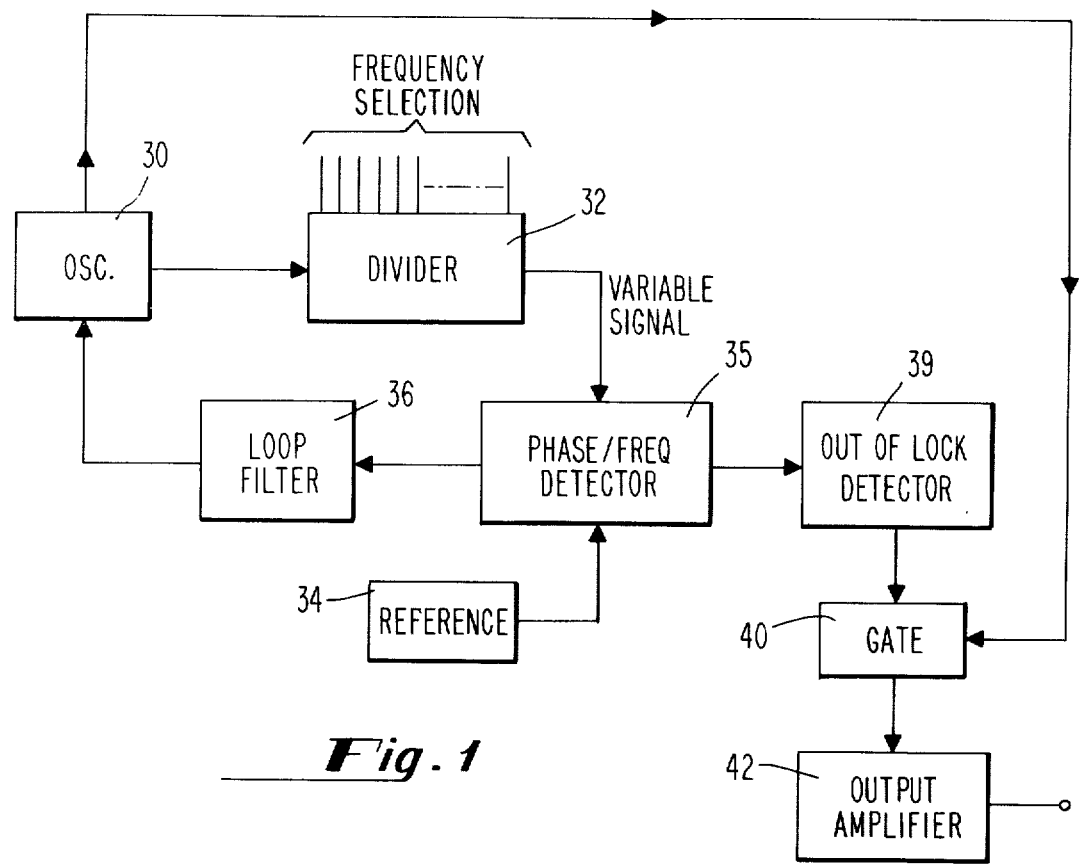
FIG. 1 is a block diagram of a phase lock system which incorporates the circuit of this invention.

Referring now to FIG. 1, there is shown a block diagram of a radio synthesizer for providing a signal of a selected radio frequency. A voltage controlled oscillator 30 is utilized to produce the desired radio frequency signal. The output of oscillator 30 is a pulse signal, and as that term is used herein it refers to a continuous train of pulses at a preselected frequency.

The output of oscillator 30 is connected to a divider shown schematically at 32, which comprises frequency selection means with which an operator can manually select a desired frequency. For example, the frequency selection means enables an operator to select a desired one of 720 communication channels each separated by 25 KHz. The divider comprises a counter which is preset by the frequency selection, to produce an output signal designated as a variable signal, which divider output is maintained at 25 KHz when the system is in the stable "in lock" condition. The 25 KHz variable signal is compared with a reference 25 KHz signal generated by reference generator 34, preferably a crystal controlled high precision oscillator. This comparison is accomplished in a phase/frequency detector 35. As used in this application, phase detection and frequency detection are used interchangeably. In the phase lock loop system which forms the environment of this invention, when the loop is in lock the phase and frequency of the variable signal are maintained precisely together with that of the reference signal.

The output of phase/frequency detector 35 is connected to loop filter 36, which produces a DC type signal which is returned to oscillator 30 as the tuning signal, whereby oscillator 30 is positioned to produce an output pulse signal of such a frequency that the variable (divided) signal is 25 KHz. At the same time, an output of the phase/frequency detector 35 is connected to out of lock detector 39, which produces a DC type signal which represents the in lock/out of lock condition of the loop. In other words, this signal is effectively a two-state signal, carrying information as to whether the loop is in lock or out of lock. As used herein, the term DC signal is meant to be either a signal of zero frequency or a very slow changing signal relative to the pulse signals involved. Also, when the variable 25 KHz signal and the reference agree in both phase and frequency, the loop is considered to be in lock.

The output of detector 39 is shown to be symbolically inputted to gate 40, along with an output from oscillator 30. Gate 40 enables the oscillator output to be transmitted through to an output amplifier 42 when the loop is in lock, and blocks transmission when the loop is out of lock, thus providing that when the system is searching for a newly selected frequency, or otherwise out of lock, no output is transmitted through to other portions of the radio equipment which utilized the synthesized radio frequency output. In practice, the circuitry of blocks 39, 40 and 42 may be combined, even though the functions are shown separately in FIG. 1.

Figure 2:
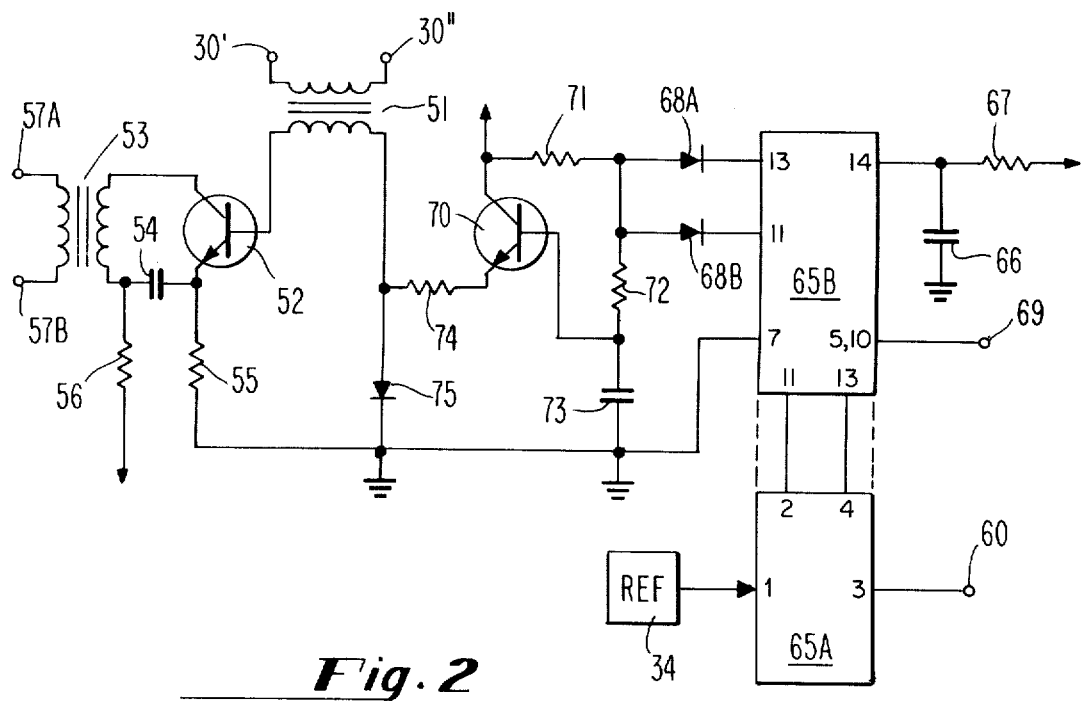
FIG. 2 is a circuit diagram of the out of lock detector of this invention, in combination with a phase detector and output amplifier.

Referring now to FIG. 2, there is shown a specific circuit diagram of the apparatus of this invention. The reference 25 KHz signal is shown as being provided by reference generator 34 and inputted to terminal 1 of an integrated circuit (IC) designated as 65, and specifically to portion 65A thereof. The divided, or variable 25 KHz signal is inputted to terminal 3 of IC 65 at node 60. Integrated circuit 65 is manufactured by Motorola, and carries the designation MC4044. The portion designated schematically as 65A comprises the phase/frequency detector, and the portion 65B carries out certain logic operations which are discussed hereinafter. When the overall synthesizer loop is in lock, such that the VCO is producing a stable output, very narrow negative pulses appear at terminals 2 and 4 of 65A, or 11 and 13 of 65B. These pulses are not sufficient to discharge capacitor 73, but merely function to maintain the system in lock. However, if the synthesizer is out of lock, wider negative pulses are present at terminals 11 and 13, which pulses are processed in 65B to produce an output at joint terminal 5, 10 which is connected to node 69, to which is connected the loop filter (block 36 in FIG. 1).

Portion 65B of the integrated circuit 65 has its terminal 14 connected to a suitable power source through resistor 67, and is connected to ground through capacitor 66. Terminal 7 is connected to ground, and terminals 11 and 13 are connected to the cathodes of diodes 68B and 68A respectively. The anodes of these diodes are connected together, and connected through resistor 71 to a suitable power source. The anode connection is also connected through resistor 72 and capacitor 73 to ground. Transistor 70 has its collector connected to resistor 71, its base connected to the junction between resistor 72 and capacitor 73, and its emitter connected to a resistor 74. The other side of resistor 74 is connected through diode 75 to ground, as well as to a first winding of transformer 51. The other winding of transformer 51, shown having designated terminals 30' and 30'' is connected to receive an output from oscillator 30. The first winding of transformer 51 is connected to the base of transistor 52, which transistor has its emitter connected through resistor 55 to ground and its collector connected to the input winding of transformer 53. The emitter is also connected through capacitor 54 to resistor 56 and to the other terminal of the input winding of transformer 53. Resistor 56 is also connected to a suitable supply. The output winding of transformer 53 is shown as being connected to terminals 57A and 57B, which constitute the output terminals of amplifier 42, which constitutes an isolation amplifier.

In operation, transistor 70 is normally in a conducting state, such that diode 75 is conducting and transistor 52 is likewise turned on. Diode 75 is chosen of a value so as to properly bias transistor 52, and presents insignificant impedance to the high frequency signal which is inputted to transistor 52. If the loop frequency is higher than the 25 KHz reference signal, negative going pulses appear at pin 11, and if the loop frequency is lower than 25 KHz, negative pulses appear at pin 13. These negative pulses are peak integrated by the RC combination of resistor 72 and capacitor 73, such that a negative DC signal appears across capacitor 73 and at the base of transistor 70, thereby turning off the transistor. When this happens, transistor 52 is likewise turned off, inhibiting transmission of the oscillator output through the output amplifier which comprises transistor 52.

In summary, applicant provides unique means for operating on signals which represent the in lock/out of lock status of the synthesizer loop, and generating from such operation a signal which either gates through the synthesizer output or inhibits transmission of the synthesizer output. It is to be noted that the IC utilized is part of the basic loop, providing the phase/frequency detection, and that the out of lock detector apparatus interfaces with the phase lock loop without affecting the design of the loop in any way. The out of lock detector comprises a minimum number of components and is extremely reliable in carrying out its function.

I claim:

1. A radio synthesizer system for generating a plurality of selectable radio frequency signals, comprising:
   a. oscillator means for generating a periodic signal, being tunable such that the frequency of said periodic signal can be varied as a function of a tuning signal;
   b. divider means for dividing the frequency of said periodic signal, said divider means having selecting means for determining the selected system frequency;
   c. frequency reference means, for generating a reference signal of a predetermined frequency and phase;
   d. phase detector means, connected to said oscillator means, for comparing said divider signal and said reference signal and producing said tuning signal as a function of the comparative phase of said signals, said phase detector means also being characterized by producing a pulsed out of lock signal when said divider and reference signals are out of phase and said system is out of lock;
   e. output means for providing the system output signal, having an input circuit connected to said oscillator means; and
   f. out of lock detector means for turning off said output means when said system is out of lock, having an input circuit connected to said phase detector means and which receives said pulsed out of lock signal, and an output circuit connected to said output means input circuit, whereby no output signal is produced by said system when it is out of lock.

2. The system as described in claim 1, wherein said phase detector is characterized by producing said pulsed out of lock signal so long as said system is out of lock.

3. The system as described in claim 2, wherein said out of lock detector comprises circuitry for integrating said pulsed out of lock signal, said integrated signal holding said output means off.

4. The system as described in claim 3, wherein said output means input circuit has an on-off device which is normally on and is biased off by said out of lock detector in response to said integrated signal.

5. In a phase lock loop system for generating a pulse signal at a given frequency, apparatus for generating a DC signal representative of when said system is in lock and when out of lock, comprising detector means for comparing a loop signal with a reference signal and producing pulses as long as said system is out of lock, and means for generating a DC signal having a polarity which is a function of whether said system is in lock, said DC signal means having a non-linear circuit connecting to said detector means for receiving said out of lock pulses, wherein said DC signal generating means comprises a capacitor in combination with a voltage source of a first polarity, said capacitor normally being charged through said source with said first polarity, and wherein said non-linear circuit comprises at least one diode.

6. The apparatus as described in claim 5, wherein said DC generating means comprises circuitry to charge said capacitor with a second polarity upon the occurrence of one of said pulses.

7. The apparatus as described in claim 6, wherein said DC signal means comprises a relatively slow charging circuit for charging said capacitor from said voltage source and a relatively fast charging circuit for charging said capacitor from said out of lock pulses.

8. The apparatus as described in claim 7, comprising a signal output circuit for providing a system output signal, and further comprising enabling means connected to said DC generating means to enable said signal output circuit in the absence of said out of lock pulses.

9. The apparatus as described in claim 8, wherein said enabling means comprises a two state device having a normal first state when said system is in lock, and which is connected to said generating means such that it is switched to a second state when said out of lock pulses are received, whereby said output circuit is disenabled.

* * * * *